US009287849B2

(12) United States Patent
Ikeuchi et al.

(10) Patent No.: US 9,287,849 B2
(45) Date of Patent: Mar. 15, 2016

(54) ELASTIC WAVE DEVICE

(71) Applicant: SKYWORKS PANASONIC FILTER SOLUTIONS JAPAN CO., LTD., Kadoma-shi (JP)

(72) Inventors: Satoru Ikeuchi, Hyogo-Ken (JP); Seiichi Hatakenaka, Osaka-Fu (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 198 days.

(21) Appl. No.: 14/130,653

(22) PCT Filed: Mar. 11, 2013

(86) PCT No.: PCT/JP2013/001548
§ 371 (c)(1),
(2) Date: Jan. 2, 2014

(87) PCT Pub. No.: WO2013/136757
PCT Pub. Date: Sep. 19, 2013

(65) Prior Publication Data
US 2014/0159833 A1 Jun. 12, 2014

(30) Foreign Application Priority Data

Mar. 14, 2012 (JP) .................................. 2012-057027

(51) Int. Cl.
*H03H 9/72* (2006.01)
*H03H 9/25* (2006.01)
(Continued)

(52) U.S. Cl.
CPC ................ *H03H 9/25* (2013.01); *H03H 9/0057* (2013.01); *H03H 9/02803* (2013.01); *H03H 9/64* (2013.01); *H03H 9/14588* (2013.01); *H03H 9/6433* (2013.01); *H03H 2250/00* (2013.01)

(58) Field of Classification Search
CPC . H03H 9/0028; H03H 9/0033; H03H 9/0038; H03H 9/0047; H03H 9/0057; H03H 9/02637; H03H 9/02685; H03H 9/02708; H03H 9/02771; H03H 9/02803; H03H 9/02842; H03H 9/02905; H03H 9/14588; H03H 9/25; H03H 9/64; H03H 9/6433; H03H 2250/00
USPC ......................................... 333/133, 193–196
See application file for complete search history.

(56) References Cited

U.S. PATENT DOCUMENTS

| 5,760,664 A * | 6/1998 | Allen ........................ H03H 9/25 |
| | | 310/313 D |
| 6,894,588 B2 * | 5/2005 | Detlefsen ............. H03H 9/6483 |
| | | 310/313 D |

(Continued)

FOREIGN PATENT DOCUMENTS

| JP | 58-223912 | * 12/1983 |
| JP | 63-97004 | * 4/1988 |

(Continued)

OTHER PUBLICATIONS

International Search Report issued in PCT/JP2013/001548, dated May 21, 2013, with English translation, 4 pages.

*Primary Examiner* — Barbara Summons
(74) *Attorney, Agent, or Firm* — Lando & Anastasi, LLP

(57) ABSTRACT

A reflector of the elastic wave resonator in an elastic wave device has first and second regions. The second region has third and fourth regions. The first region is located near to the IDTs of the reflector, while the second region is located farther from them. The third region is located nearer to the IDTs in the second region, while the fourth region is located farther from them. As a result that the center frequency of the reflection band in the fourth region is lower than that in the third region, an elastic wave device with low energy loss and insertion loss is provided.

20 Claims, 10 Drawing Sheets

(51) Int. Cl.
 *H03H 9/02* (2006.01)
 *H03H 9/64* (2006.01)
 *H03H 9/00* (2006.01)
 *H03H 9/145* (2006.01)

(56) References Cited

U.S. PATENT DOCUMENTS

| | | | |
|---|---|---|---|
| 7,078,989 B2 * | 7/2006 | Inoue | H03H 9/02685 333/133 |
| 2003/0169129 A1 | 9/2003 | Takamine | |
| 2004/0077325 A1 * | 4/2004 | Takamine | H03H 9/0071 455/286 |
| 2004/0212454 A1 * | 10/2004 | Nakamura | H03H 9/0038 333/133 |
| 2005/0001699 A1 * | 1/2005 | Takamine | H03H 9/0042 333/195 |
| 2005/0035831 A1 | 2/2005 | Kawachi et al. | |

FOREIGN PATENT DOCUMENTS

| | | | |
|---|---|---|---|
| JP | 2001-332954 A | | 11/2001 |
| JP | 2003-188674 | * | 7/2003 |
| JP | 2003-258595 A | | 9/2003 |
| JP | 2003-289234 A | | 10/2003 |
| JP | 2008-085720 A | | 4/2008 |
| JP | 2012-005114 A | | 1/2012 |

* cited by examiner

ELASTIC WAVE DEVICE

RELATED APPLICATIONS

This application is the U.S. National Phase under 35 U.S.C. §371 of International Application No. PCT/JP2013/001548, filed on Mar. 11, 2013, which in turn claims the benefit of Japanese Application No. 2012-057027, filed on Mar. 14, 2012, the disclosures of which Applications are incorporated by reference herein.

TECHNICAL FIELD

The present invention relates to an elastic wave device including multiple radio-frequency filters with different passbands.

BACKGROUND ART

Recent mobile phones and other devices often use duplexers and dual filters as elastic wave devices including multiple radio-frequency filters with different passband.

FIG. 9 is a circuit diagram of existing elastic wave device 1.

Existing elastic wave device 1 is a dual filter including low-frequency filter 3 having passing characteristics in the low-frequency passband (relatively low frequencies); high-frequency filter 4 having passing characteristics in the high-frequency passband (relatively high frequencies); input terminals 5 and 6; and output terminals 7 and 8, all formed on piezoelectric substrate 2. Input terminal 5 is connected to low-frequency filter 3; input terminal 6, to high-frequency filter 4; and output terminals 7 and 8, to both of low-frequency filter 3 and high-frequency filter 4.

In low-frequency filter 3, input terminal 5 is connected in sequence to elastic wave resonator 9, elastic wave resonator 10, and output terminals 7 and 8. In high-frequency filter 4, input terminal 6 is connected in sequence to elastic wave resonator 11, elastic wave resonator 12, and output terminals 7 and 8. Here, all the elastic wave resonators shown in FIG. 9 are of longitudinally-coupled type.

Elastic wave resonator 10 includes multiple interdigital transducers (expressed as IDT, hereinafter) 15 between a pair of reflectors 13A and 13B; similarly, elastic wave resonator 12 includes multiple interdigital transducers (expressed as IDT, hereinafter) 16 between a pair of reflectors 14A and 14B.

In an existing elastic wave device, setting is made so that the reflection band (stop band) of reflector 13A will cover the low-frequency passband of low-frequency filter 3 and that the reflection band (stop band) of reflector 14A will cover the high-frequency passband of high-frequency filter 4.

In a passband, increasing the reflection of electric signals reduces the energy loss to decrease the insertion loss. In a stop band, decreasing the reflection of electric signals dissipates the electric energy to increase the attenuation.

A description is made of the concept of the passing characteristics of an existing elastic wave device referring to FIG. 10. Diagram (a) of FIG. 10 shows the insertion loss of low-frequency filter 3; (b), the reflectivity of reflector 13A of low-frequency filter 3; (c), the insertion loss of high-frequency filter 4; and (d), the reflectivity of reflector 14A of high-frequency filter 4. Examples of prior art documents include following patent literature 1 for instance.

In the existing elastic wave device, low-frequency filter 3 and high-frequency filter 4 are connected to common output terminals 7 and 8. Consequently, when low-frequency filter 3 outputs electric signals in the low-frequency passband to output terminals 7 and 8, some of the signals result in reaching high-frequency filter 4 as well. At this moment, the energy of the signals is dissipated through reflectors 14A and 14B of high-frequency filter 4, causing the loss of electric energy. Hence, the existing elastic wave device undesirably involves high insertion loss at low-frequency filter 3.

In the same way, when high-frequency filter 4 outputs electric signals in the high-frequency passband to output terminals 7 and 8, some of the signals result in reaching low-frequency filter 3 as well. At this moment, the energy of the signals is dissipated through reflectors 13A and 13B of low-frequency filter 3, causing the loss of electric energy. Hence, the existing elastic wave device undesirably involves high insertion loss at high-frequency filter 4.

CITATION LIST

Patent Literature

PTL 1: Japanese Patent Unexamined Publication No. 2003-289234

SUMMARY OF THE INVENTION

An object of the present invention is to provide an elastic wave device with low insertion loss to solve the above-described existing problems.

To achieve the above object, in one aspect of the present invention, at least one reflector forming the elastic wave resonator of the low-frequency filter has first and second regions, and the second region has third and fourth regions. The first region is located nearer to the IDTs of the reflector, while the second region is located farther from the IDTs of the reflector. Further, the third region is located nearer to the IDTs in the second region, while the fourth region is located farther from the IDTs in the second region. The reflection band in the first region covers the low-frequency passband; and the reflection band in the second region covers the high-frequency passband. The center frequency of the reflection band in the fourth region is lower than that in the third region.

Alternatively, in another aspect of the present invention, at least one reflector forming the elastic wave resonator of the high-frequency filter has fifth and sixth regions, and the sixth region has seventh and eighth regions. The fifth region is located nearer to the IDTs of the reflector, while the sixth region is located farther from the IDTs of the reflector. Further, the seventh region is located nearer to the IDTs in the sixth region, while the eighth region is located farther from the IDTs in the sixth region. The reflection band in the fifth region covers the high-frequency passband; and the reflection band in the sixth region covers the low-frequency passband. The center frequency of the reflection band in the eighth region is higher than that in the seventh region.

The present invention reduces the insertion loss of the low- and high-frequency filters in a well balanced manner. Hence, the present invention provides superior advantages that the insertion loss is reduced in an elastic wave device including low- and high-frequency filters connected to a common signal terminal.

DESCRIPTION OF EMBODIMENT

Figure 1:
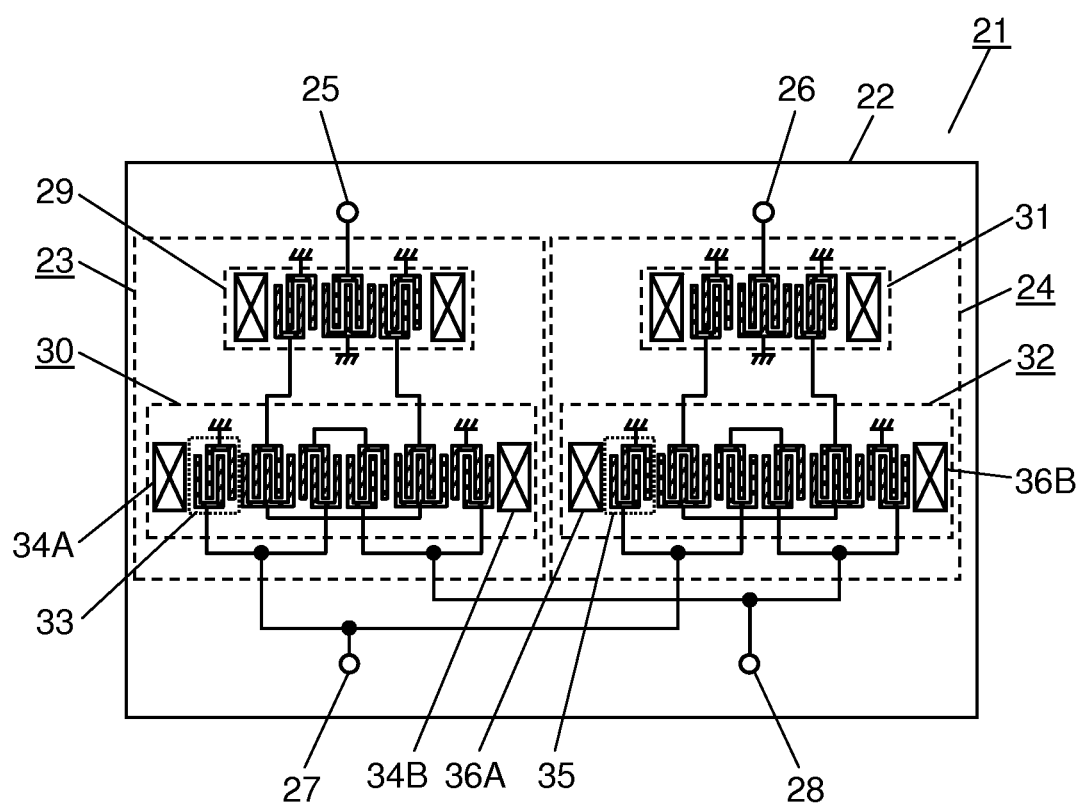
FIG. 1 is a circuit diagram of an elastic wave device according to an embodiment of the present invention.

FIG. 1 is a circuit diagram of an elastic wave device according to an embodiment of the present invention.

Elastic wave device 21 is a dual filter including low-frequency filter 23 having a low-frequency passband (where the center frequency of the passband is relatively low); high-frequency filter 24 having a high-frequency passband (where the center frequency of the passband is relatively high); input terminals 25 and 26; and output terminals 27 and 28, all formed on piezoelectric substrate 22. Input terminals 25 and 26 are unbalanced; output terminals 27 and 28 are balanced.

Input terminal 25 is connected to low-frequency filter 23; input terminal 26 is connected to high-frequency filter 24. Output terminals 27 and 28 are connected to both low-frequency filter 23 and high-frequency filter 24.

In this embodiment, piezoelectric substrate 22 is made of rotated Y-cut X-propagation lithium tantalate single crystal.

In low-frequency filter 23, input terminal 25 is connected in sequence to elastic wave resonator 29, elastic wave resonator 30, and output terminals 27 and 28. In high-frequency filter 24, input terminal 26 is connected in sequence to elastic wave resonator 31, elastic wave resonator 32, and output terminals 27 and 28. Here, all the elastic wave resonators according to the embodiment are of longitudinally-coupled type.

Elastic wave resonator 30 has multiple IDTs 33 placed between a pair of reflectors 34A and 34B.

Elastic wave resonator 32 has multiple IDTs 35 placed between a pair of reflectors 36A and 36B.

Figure 2A:
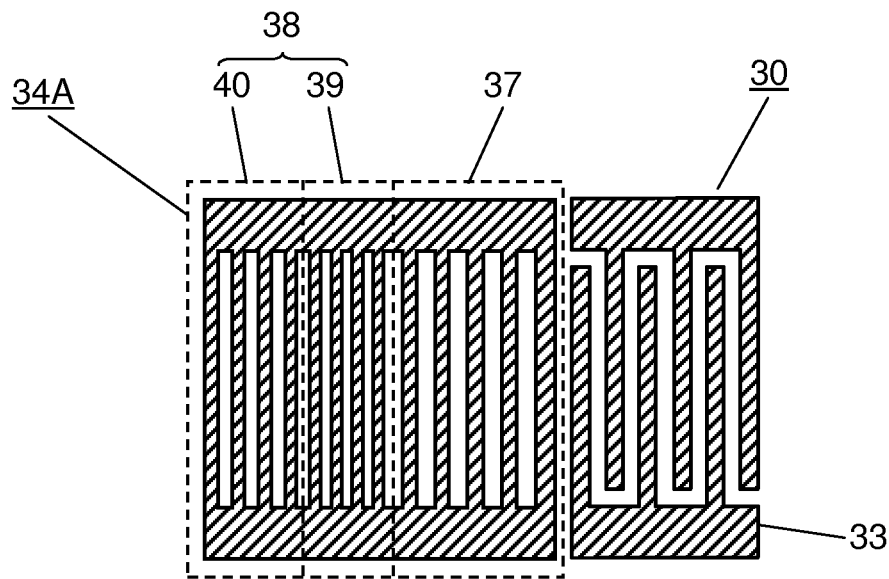
FIG. 2A is an enlarged view of the substantial part of the elastic wave device.
Figure 2B:
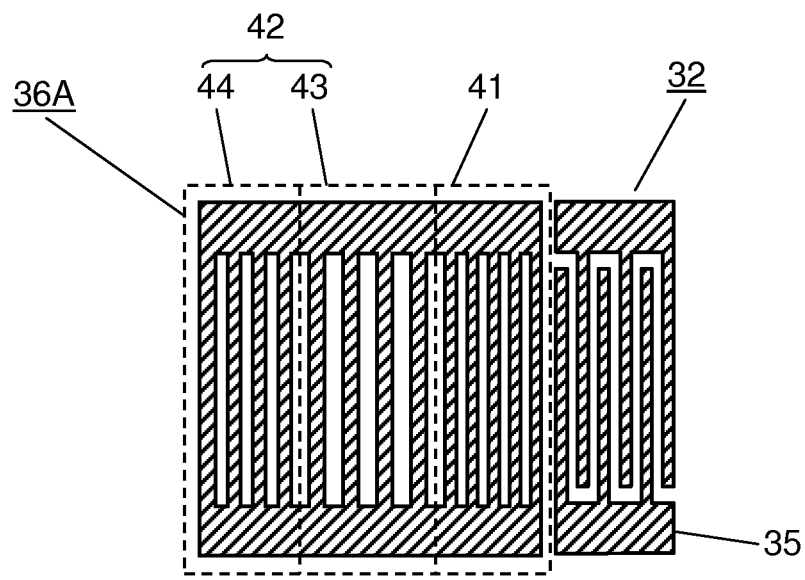
FIG. 2B is an enlarged view of the substantial part of the elastic wave device.

FIG. 2A is an enlarged view of the substantial part of elastic wave resonator 30; FIG. 2B is an enlarged view of the substantial part of elastic wave resonator 32.

FIG. 2A shows the structure of reflector 34A in elastic wave resonator 30 of low-frequency filter 23. Reflector 34A is composed of first region 37 and second region 38. First region 37 is located near to IDTs 33, while second region 38 is farther from the IDTs 33. Further, second region 38 is composed of third region 39 and fourth region 40. Within second region 38, third region 39 is located nearer to IDTs 33, while fourth region 40 is located farther from IDTs 33.

Hereinafter, the reflection band in first region 37 is expressed as the first reflection band; that in second region 38, the second reflection band; that in third region 39, the third reflection band; and that in fourth region 40, the fourth reflection band.

Figure 3:
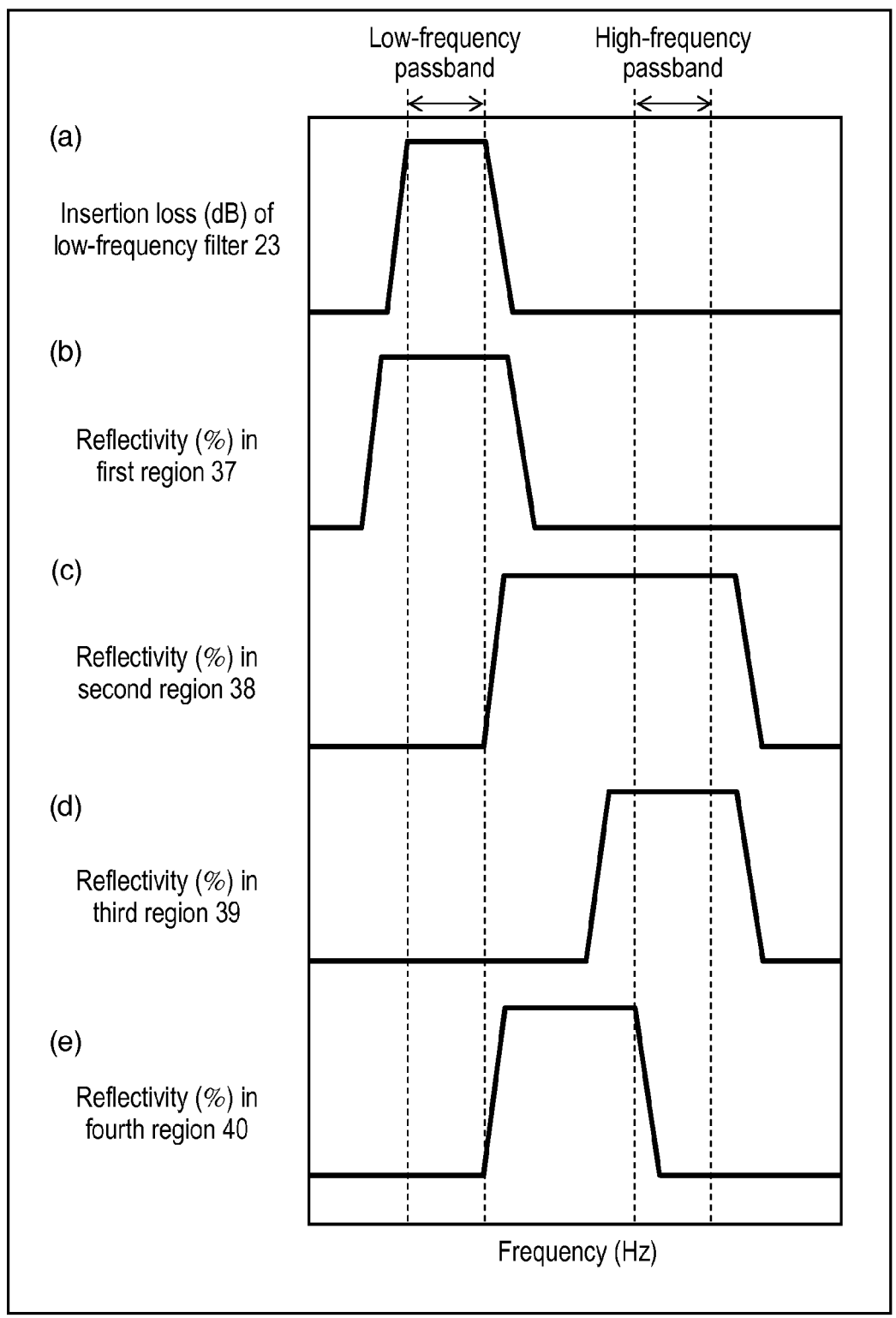
FIG. 3 is a diagram illustrating the concept of the passing characteristics of the elastic wave device.

As shown in FIG. 3, the first reflection band covers the low-frequency passband; the second reflection band covers the high-frequency passband. The center frequency of the reflection band in the fourth region is lower than that in the third region.

Setting each pitch of the grid electrodes in first region 37, third region 39, and fourth region 40 allows setting each reflection band of the regions. Setting each pitch of the grid electrodes in third region 39 and fourth region 40 allows setting the second reflection band.

In this embodiment, as shown in FIG. 2A, the pitch of the electrodes extending lengthwise (in the drawing) in first region 37 is the widest; that of the electrodes extending lengthwise (in the drawing) in fourth region is the next widest; and that of the electrodes extending lengthwise (in the drawing) in third region 39 is the narrowest.

That is, setting is made in reflector 34A of elastic wave resonator 30 so that the average pitch of the grid electrodes in second region 38 will be narrower than that in first region 37; and that the average pitch of the grid electrodes in third region 39 will be narrower than that in fourth region 40.

In the embodiment shown in FIG. 2A, all the pitches of the grid electrodes are equal but not necessarily need to, where the average pitch represents the reflection band.

In the embodiment shown in FIG. 2A, the electrodes are integrally formed, but not limited to this form as long as the electrodes are arranged at given intervals. For example, rod-shaped electrodes may be placed on piezoelectric substrate 22.

FIG. 2B shows the structure of reflector 36A in elastic wave resonator 32 of high-frequency filter 24. In reflector 36A, fifth region 41 is located nearer to IDTs 35, while sixth region 42 is located farther from IDTs 35. Further, seventh region 43 is located nearer to IDTs 35 in sixth region 42, while eighth region 44 is located farther from IDTs 35 in sixth region 42.

Hereinafter, the reflection band in fifth region 41 is expressed as the fifth reflection band; that in sixth region 42, the sixth reflection band; that in seventh region 43, the seventh reflection band; and that in eighth region 44, the eighth reflection band.

Figure 4:
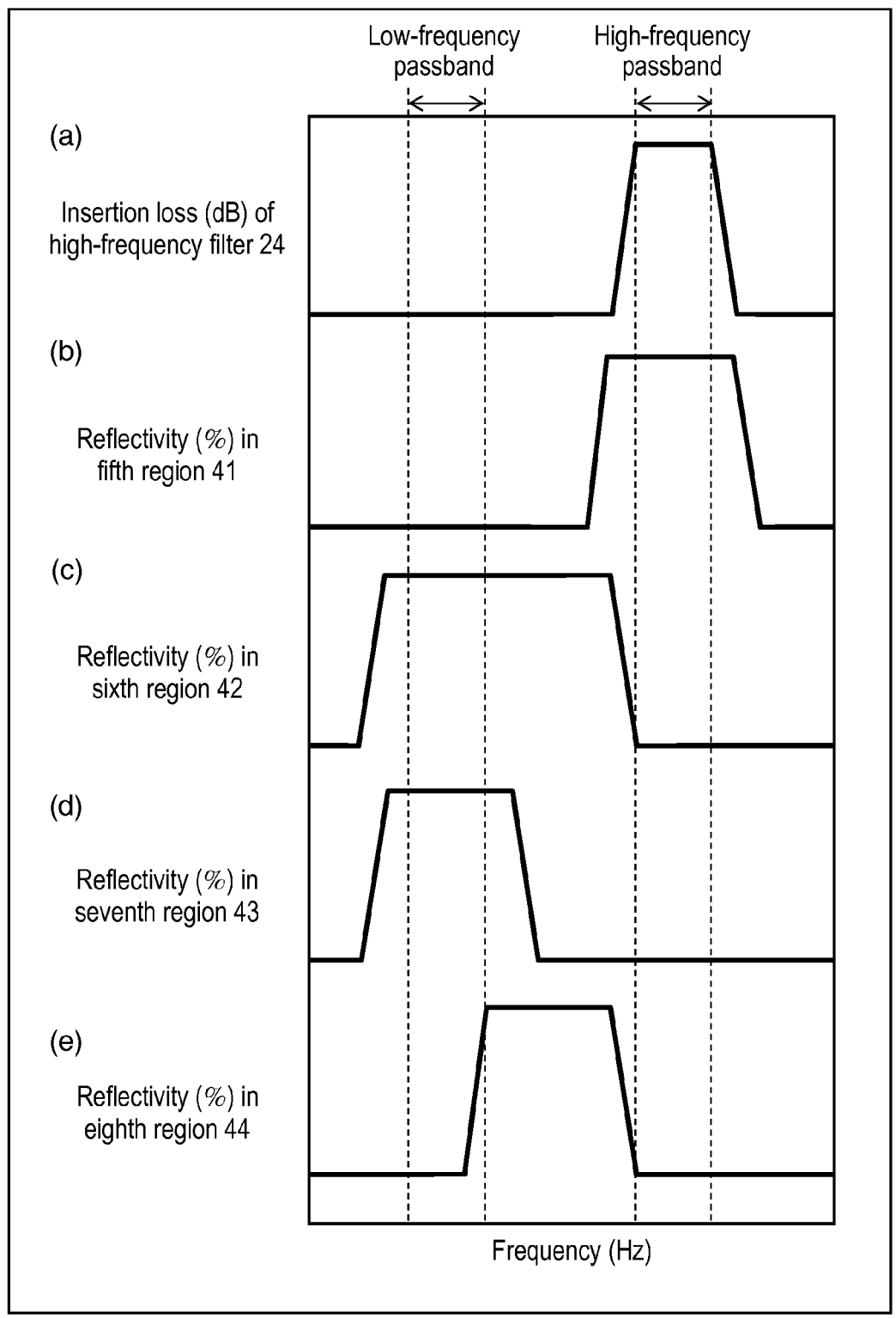
FIG. 4 is another diagram illustrating the concept of the passing characteristics of the elastic wave device.

As shown in FIG. 4, the fifth reflection band covers the high-frequency passband; the sixth reflection band covers the low-frequency passband. The center frequency of the eighth reflection region is higher than that in the seventh.

Setting each pitch of the grid electrodes in fifth region 41, seventh region 43, and eighth region 44 allows setting each reflection band. Setting each pitch of the grid electrodes in seventh region 43 and eighth region 44 allows setting the reflection band in sixth region 42.

That is, setting is made in reflector 36A of elastic wave resonator 32 so that the average pitch of the grid electrodes in sixth region 42 will be wider than that in fifth region 41; and that the average pitch of the grid electrodes in seventh region 43 will be wider than that in eighth region 44.

Here, the shape of the electrodes of reflector 36A is not limited to that of FIG. 2B, in the same way as in reflector 34A.

Next, a description is made of the passing characteristics of an elastic wave device according to the embodiment of the present invention and of the reflection characteristics of each reflector.

FIGS. 3 and 4 are conceptual diagrams of the passing characteristics and reflection characteristics of elastic wave device 21 according to the embodiment of the present invention.

Diagram (a) of FIG. 3 conceptually shows the insertion loss of low-frequency filter 23, which has its passing characteristics in the low-frequency passband.

Diagram (b) of FIG. 3 conceptually shows the reflection characteristics in first region 37 in reflector 34A of low-frequency filter 23, where first region 37 includes the first reflection band covering the low-frequency passband.

Diagram (c) of FIG. 3 conceptually shows the reflection characteristics in second region 38 in reflector 34A of low-frequency filter 23, where second region 38 includes the second reflection band covering the high-frequency passband.

Diagram (d) of FIG. 3 conceptually shows the reflection characteristics in third region 39 in reflector 34A of low-frequency filter 23, where third region 39 includes the third reflection band at the higher side of the reflection band in second region 38.

Diagram (e) of FIG. 3 conceptually shows the reflection characteristics in fourth region 40 in reflector 34A of low-frequency filter 23, where fourth region 40 includes the fourth reflection band at the lower side of the reflection band in second region 38.

Diagram (a) of FIG. 4 conceptually shows the insertion loss of high-frequency filter 24, which has its passing characteristics in the high-frequency passband.

Diagram (b) of FIG. 4 conceptually shows the reflection characteristics in fifth region 41 in reflector 36A of high-frequency filter 24, where fifth region 41 includes the fifth reflection band covering the high-frequency passband.

Diagram (c) of FIG. 4 conceptually shows the reflection characteristics in sixth region 42 in reflector 36A of high-frequency filter 24, where sixth region 42 includes the sixth reflection band covering the low-frequency passband.

Diagram (d) of FIG. 4 conceptually shows the reflection characteristics in seventh region 43 in reflector 36A of high-frequency filter 24, where seventh region 43 includes the seventh reflection band located at the lower side of the reflection band in sixth region 42.

Diagram (e) of FIG. 4 conceptually shows the reflection characteristics in eighth region 44 in reflector 36A of high-frequency filter 24, where eighth region 44 includes the eighth reflection band located at the higher side of the reflection band in sixth region 42.

In reflector 34A of low-frequency filter 23, as a result that second region 38 that includes its reflection band covering the high-frequency passband is provided far from IDTs 33, some electric signals in the high-frequency passband that have branch-flown into low-frequency filter 23 can be reflected in second region 38. Hence, this embodiment prevents the energy of electric signals from being dissipated outside reflector 34A. Further, this structure causes the electric energy reflected to return to high-frequency filter 24, thereby reducing the insertion loss of high-frequency filter 24. In reflector 34A of low-frequency filter 23, as a result that first region 37 that includes its reflection band covering the low-frequency passband is placed close to IDTs 33, the passing characteristics of low-frequency filter 23 in the low-frequency passband do not deteriorate but are favorably maintained. In second region 38, as a result that the reflection band in fourth region 40 is provided at a side lower than the reflection band in third region 39 (where third region 39 is near to IDTs 33, and fourth region 40 is farther from IDTs 33), the insertion loss in the passband of low-frequency filter 23 and that of high-frequency filter 24 are favorably reduced in a well balanced manner.

In this embodiment, further details about the structure of reflector 34B are omitted; the structure is the same as that of reflector 34A. In this embodiment, IDTs 33 are placed at the right of reflector 34A; IDTs 33 are placed at the left of reflector 34B. Hence in reflector 34B, first region 37, third region 39, and fourth region 40 are placed in the order opposite to that in reflector 34A.

The above-described structure of reflector 34A of low-frequency filter 23 is applicable to reflector 36A of high-frequency filter 24 as well.

In reflector 36A of high-frequency filter 24, as a result that sixth region 42 that includes its reflection band in the low-frequency passband is provided far from IDTs 35, some electric signals in the low-frequency passband that have branch-flown into high-frequency filter 24 can be reflected in sixth region 42. Hence, this structure prevents the energy of electric signals from being dissipated outside reflector 36A. Further, this structure causes the electric energy reflected to return to low-frequency filter 23, thereby reducing the insertion loss of low-frequency filter 23. Simultaneously in reflector 36A of high-frequency filter 24, as a result that fifth region 41 that includes its reflection band in the high-frequency passband is placed close to IDTs 35, the passing characteristics of high-frequency filter 24 in the high-frequency passband do not deteriorate but are favorably maintained. In sixth region 42, as a result that the reflection band in eighth region 44 is provided at a side higher than the reflection band in seventh region 43 (where seventh region 43 is nearer to IDTs 35 and eighth region 44 is farther from IDTs 35), the insertion loss in the passband of low-frequency filter 23 and that of high-frequency filter 24 are favorably reduced in a well balanced manner.

Although the reflection bands of the regions may overlap with one another, the positional relationship of the reflection bands is specified by comparing the center frequencies of the reflection bands.

In this embodiment, further details about the structure of reflector 36B are omitted; the structure is the same as that of reflector 36A. In this embodiment, IDTs 35 are placed at the right of reflector 36A; IDTs 35 are placed at the left of reflector 36B. Hence in reflector 36B, fifth region 41, seventh region 43, and eighth region 44 are placed in the order opposite to that in reflector 36A.

Next, a description is made of the electrical characteristics of an elastic wave device according to the embodiment of the present invention using the results of simulation.

Figure 5:
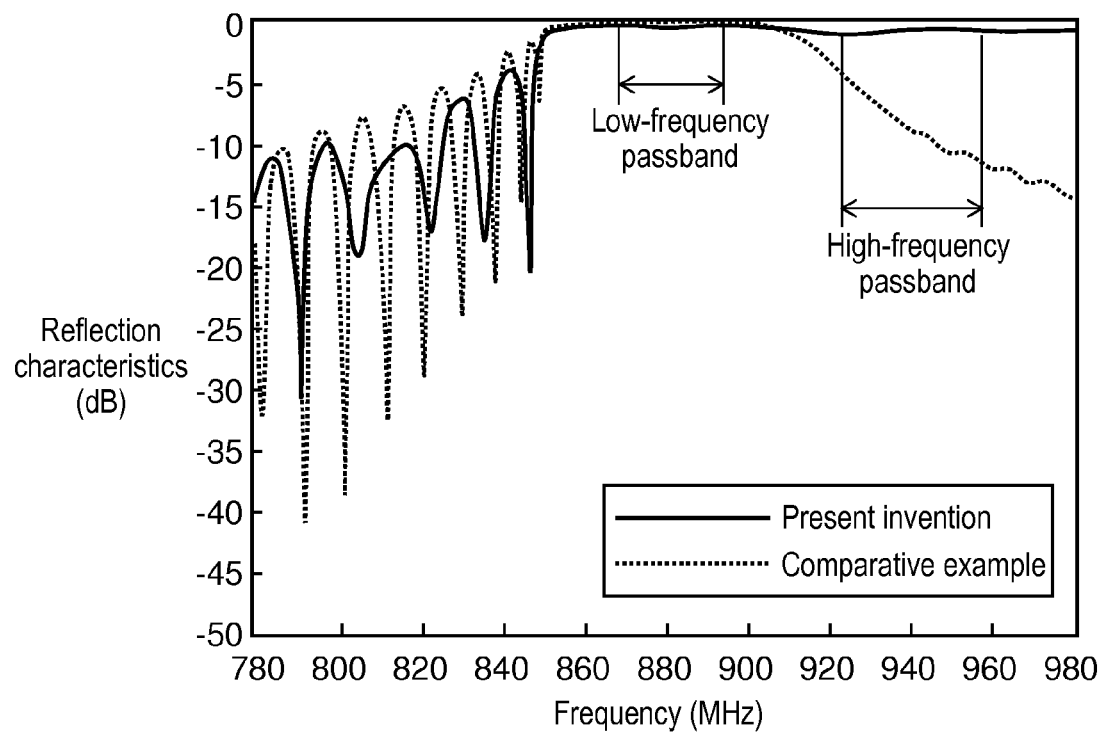
FIG. 5 is a diagram illustrating the passing characteristics of the elastic wave device.

FIG. 5 shows the reflection characteristics of the reflector of the low-frequency filter in a dual filter. In FIG. 5, the solid line represents the reflection characteristics of reflector 34A of elastic wave device 21 according to the embodiment of the present invention; the broken line as a comparative example, those of reflector 13A of existing elastic wave device 1. The reflection band of reflector 13A in the comparative example covers the low-frequency passband and does not cover the high-frequency passband; the reflection band of reflector 34A of the present invention covers both low- and high-frequency passbands.

Figure 6:
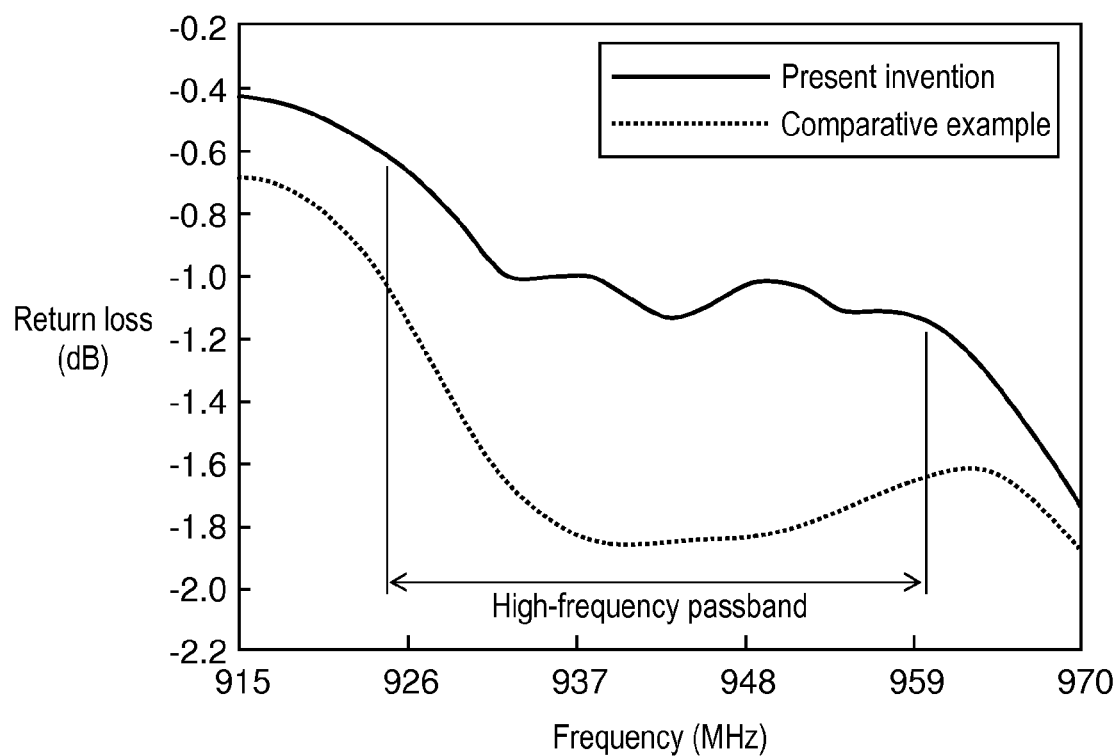
FIG. 6 is a diagram illustrating the passing characteristics of the elastic wave device.

FIG. 6 shows as return loss the level of reflection of signals within the high-frequency passband that run from the high-frequency filter to the low-frequency filter in a dual filter. A return loss closer to zero indicates that fewer electric signals leak out to the low-frequency filter to favorably reflect electric signals. In FIG. 6, the solid line represents the return loss in the high-frequency passband, of low-frequency filter 23 of elastic wave device 21 according to the embodiment of the present invention. The broken line as a comparative example represents the return loss of low-frequency filter 3 of existing elastic wave device 1. Low-frequency filter 3 of elastic wave device 1 as the comparative example exhibits a return loss of approximately −1.8 dB, which is approximately 81% in reflection coefficient. Meanwhile, low-frequency filter 23 of elastic wave device 21 of the present invention exhibits a return loss of approximately −1.0 dB, which is approximately 89% in reflection coefficient. This proves that an elastic wave device of this embodiment significantly increases the level of reflection of signals in the high-frequency passband.

Figure 7:
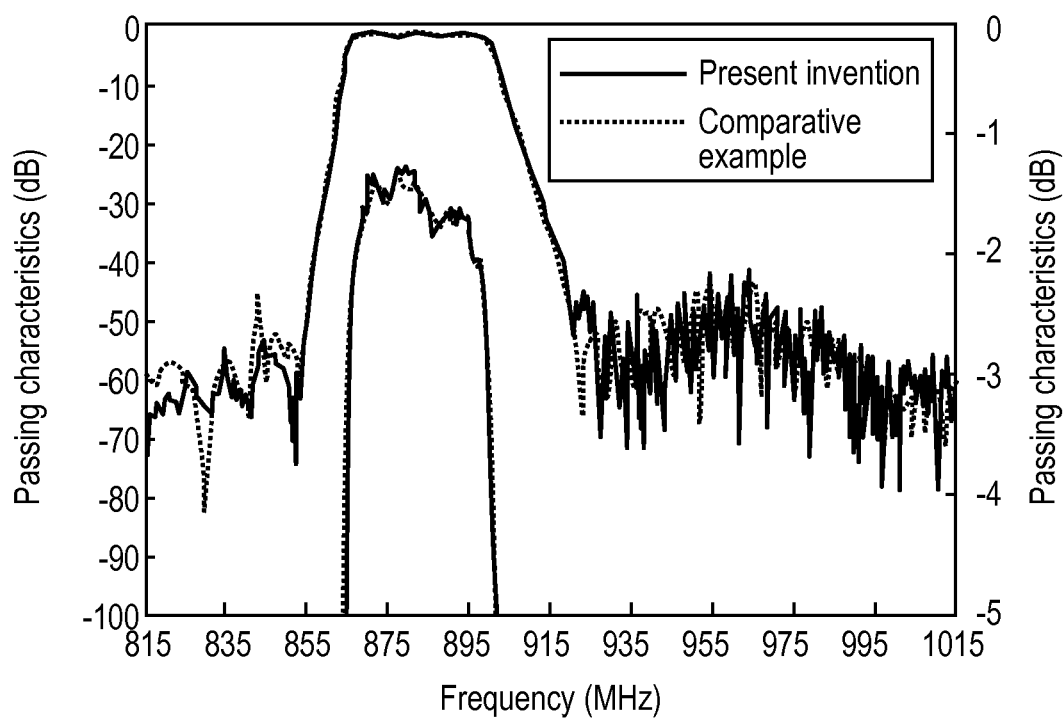
FIG. 7 is a diagram illustrating the passing characteristics of the elastic wave device.

FIG. 7 shows the passing characteristics of the low-frequency filter in a dual filter. In FIG. 7, the solid line represents the passing characteristics of low-frequency filter 23 in elastic wave device 21 according to the embodiment of the present invention. The broken line as a comparative example represents the passing characteristics of low-frequency filter 3 in existing elastic wave device 1. The right scale is a 10 times enlargement of the left scale and corresponds to the enlarged view of the low-frequency passband and its periphery. Comparing to the comparative example proves that low-frequency filter 23 of elastic wave device 21 of this embodiment exhibits low insertion loss in the low-frequency passband and favorably confines signal energy. Further, low-frequency filter 23 of elastic wave device 21 of this embodiment proves to provide attenuation more favorable than the comparative example.

Figure 8:
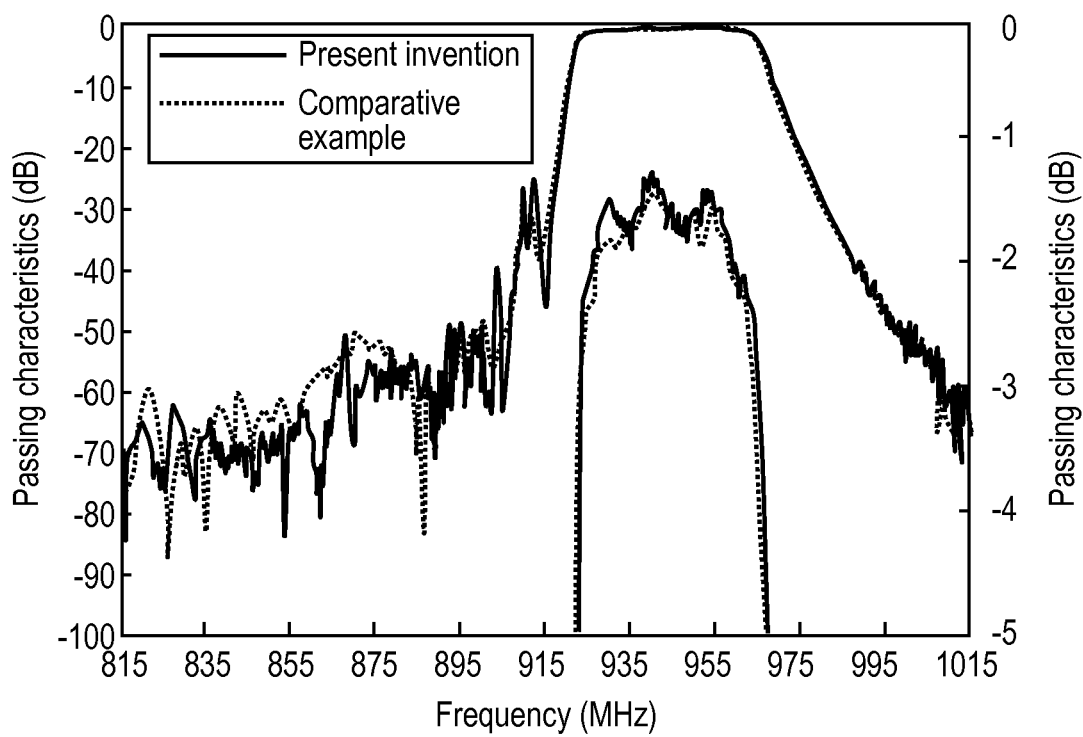
FIG. 8 is a diagram illustrating the passing characteristics of the elastic wave device.
Figure 9:
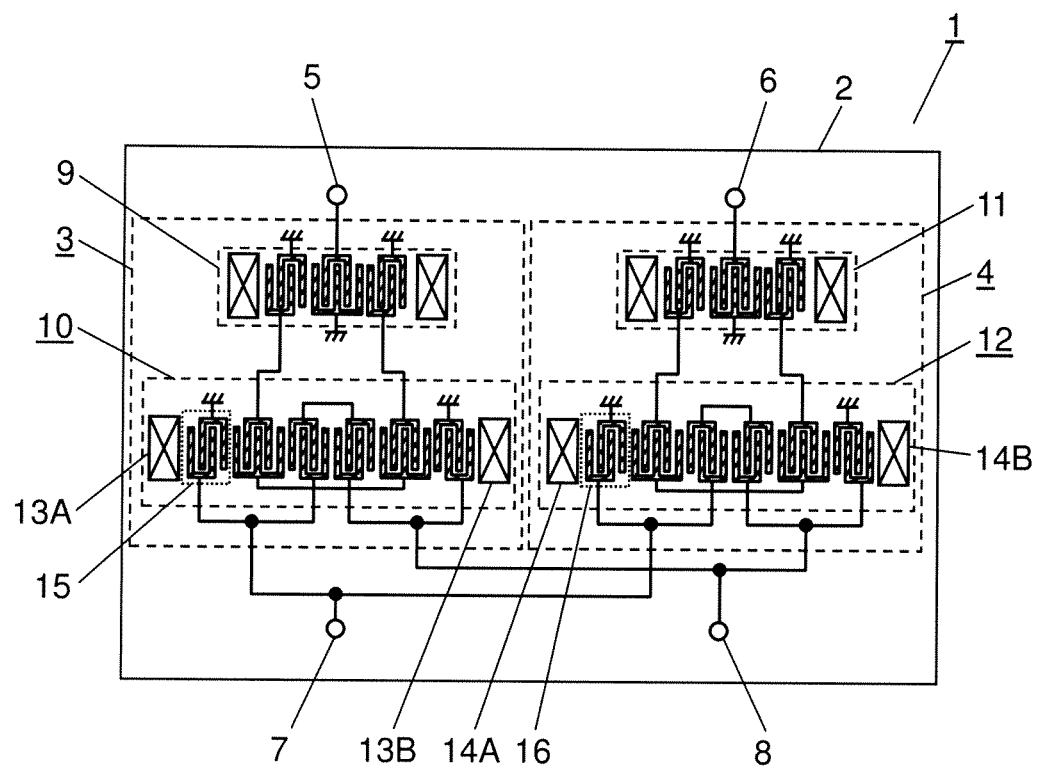
FIG. 9 is a circuit diagram of an existing elastic wave device.
Figure 10:
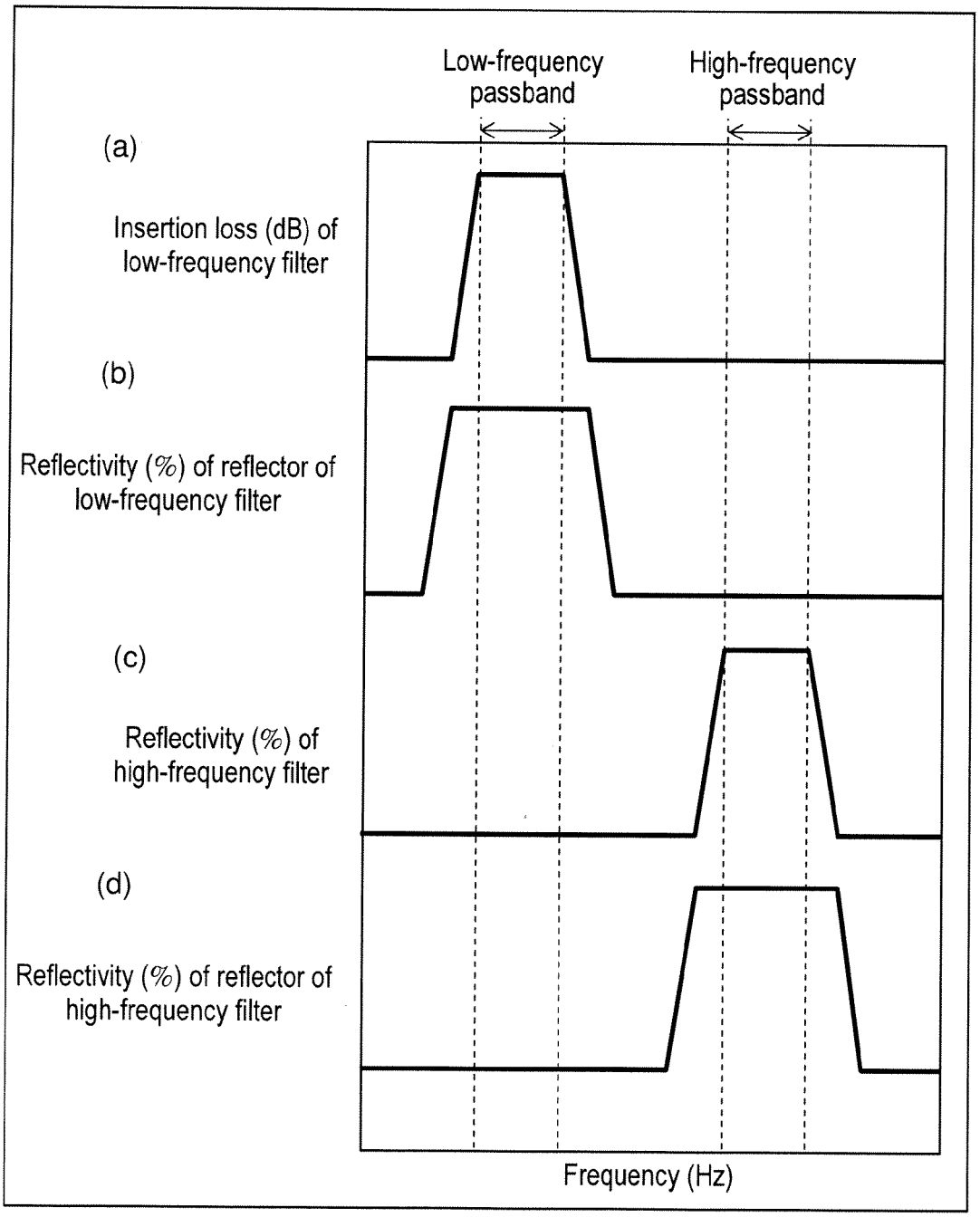
FIG. 10 is a diagram illustrating the concept of the passing characteristics of the existing elastic wave device.

FIG. 8 shows the passing characteristics of the high-frequency filter in a dual filter. In FIG. 8, the solid line represents the passing characteristics of high-frequency filter 24 in elastic wave device 21 according to the embodiment of the present invention. The broken line as a comparative example represents the passing characteristics of high-frequency filter 4 in existing elastic wave device 1. The right scale is a 10 times enlargement of the left scale and corresponds to the enlarged view of the high-frequency passband and its periphery. Comparing to the comparative example proves that high-frequency filter 24 of elastic wave device 21 of this embodiment exhibits low insertion loss in the high-frequency passband and favorably confines signal energy. Further, high-frequency filter 24 of elastic wave device 21 of this embodiment proves to provide attenuation more favorable than the comparative example in the lower side of the high-frequency band.

Above-described elastic wave device 21 according to the embodiment reduces the insertion loss of low-frequency filter 23 and high-frequency filter 24 in a well balanced manner.

As in this embodiment, when the elastic wave device includes multiple elastic wave resonators, all of them do not necessarily require a reflector shown in FIG. 2A or 2B; it is adequate if at least one elastic wave resonator be an elastic wave resonator according to the above-described embodiment.

Although elastic wave device 21 according to the embodiment includes a pair of reflectors in its elastic wave resonator, both of them do not need to be structured as the reflector described in this embodiment. As long as at least one reflector in the elastic wave resonator is such a reflector, the insertion loss of an adjacent filter (high- or low-frequency filter) is reduced.

The description is made of elastic wave device 21 according to the embodiment of the present invention that is applied to reflectors 34A, 34B, 36A, and 36B of longitudinally-coupled elastic wave resonators 30 and 32. However, applying the invention to a one-terminal pair filter (high- or low-frequency filter) provides the same advantage.

For example, the invention may be applied to a one-terminal pair elastic wave resonator connected in series or in parallel with a longitudinally-coupled elastic wave resonator. The invention may be applied to a one-terminal pair elastic wave resonator that forms a ladder-type elastic wave filter.

The above-described structure provides the same advantage.

However, a typical longitudinally-coupled elastic wave resonator has a small number of total pairs of electrode fingers, which causes out-of-band electric energy to be dissipated more than a one-terminal pair elastic wave resonator. Hence, the present invention provides a prominent advantage especially when applied to a longitudinally-coupled elastic wave resonator.

In elastic wave device 21 according to the embodiment of the present invention shown above, low-frequency filter 23 and high-frequency filter 24 are connected to common output terminals 27 and 28, where the common terminal may be an input terminal or another signal terminal.

Industrial Applicability

An elastic wave device according to the present invention reduces the loss of resonance energy to decrease the insertion loss and is mainly useful for an elastic wave filter used for a mobile communication device.

The invention claimed is:

1. An elastic wave device comprising:
a piezoelectric substrate;
a high-frequency filter formed on the piezoelectric substrate having a high-frequency passband; and
a low-frequency filter formed on the piezoelectric substrate having a low-frequency passband lower than the high frequency passband, the low-frequency filter including a first elastic wave resonator, the first elastic wave resonator having a plurality of interdigital transducers disposed between a pair of reflectors, at least one reflector of the pair of reflectors having a first region and a second region, the second region having a third region and a fourth region, the first region located nearer to the plurality of interdigital transducers than the second region, the third region located nearer to the plurality of interdigital transducers than the fourth region, a reflection band in the first region covering the low-frequency passband, a reflection band in the second region covering the high-frequency passband, and a center frequency of a reflection band in the fourth region being lower than a center frequency of a reflection band of the third region.

2. The elastic wave device of claim 1 wherein the first elastic wave resonator is directly connected to a first balanced output terminal.

3. The elastic wave device of claim 1 wherein the low-frequency filter further includes a second elastic wave resonator connected to the first elastic wave resonator.

4. The elastic wave device of claim 1 wherein the reflection band in the fourth region corresponds to a low-frequency side of the reflection band in the second region and the reflection band in the third region corresponds to a high-frequency side of the reflection band in the second region.

5. The elastic wave device of claim 1 wherein a pitch of grid electrodes in the third and the fourth regions controls a frequency of the reflection band in the second region.

6. The elastic wave device of claim 1 wherein each of the reflection bands in the first, the second, the third, and the fourth regions is controlled by the average pitch of grid electrodes in each respective region.

7. The elastic wave device of claim 1 wherein the first elastic wave resonator is a longitudinally coupled elastic wave resonator.

8. The elastic wave device of claim 1 wherein an average pitch of grid electrodes in the second region is narrower than an average pitch of grid electrodes in the first region.

9. The elastic wave device of claim 8 wherein an average pitch of grid electrodes in the third region is narrower than an average pitch of grid electrodes in the fourth region.

10. The elastic wave device of claim 1 wherein the reflection band in the third region overlaps the reflection band in the fourth region.

11. The elastic wave device of claim 1 further comprising a second elastic wave resonator electrically connected between the first elastic wave resonator and an unbalanced input terminal.

12. An elastic wave device comprising:
a piezoelectric substrate;
a low-frequency filter formed on the piezoelectric substrate having a low-frequency passband; and
a high-frequency filter formed on the piezoelectric substrate having a high-frequency passband higher than the low-frequency passband, the high-frequency filter including a first elastic wave resonator, the first elastic wave resonator having a plurality of interdigital transducers disposed between a pair of reflectors, at least one reflector of the pair of reflectors having a first region and a second region, the second region having a third region and a fourth region, the first region located nearer to the plurality of interdigital transducers than the second region, the third region located nearer to the plurality of interdigital transducers than the fourth region, a reflection band in the first region covering the high-frequency passband, a reflection band in the second region covering the low-frequency passband, and a center frequency of a reflection band in the fourth region being higher than a center frequency of a reflection band in the third region.

13. The elastic wave device of claim 12 wherein the high-frequency filter further includes a second elastic wave resonator connected to the first elastic wave resonator.

14. The elastic wave device of claim 12 wherein the first elastic wave resonator is directly connected to a first balanced output terminal.

15. The elastic wave device of claim 12 wherein the reflection band in the fourth region corresponds to a high-frequency side of the reflection band in the second region and the reflection band in the third region corresponds to a low-frequency side of the reflection band in the second region.

16. The elastic wave device of claim 12 wherein an average pitch of grid electrodes in the second region is wider than an average pitch of grid electrodes in the first region.

17. The elastic wave device of claim 16 wherein an average pitch of grid electrodes in the third region is wider than an average pitch of grid electrodes in the fourth region.

18. The elastic wave device of claim 12 wherein the reflection band in the third region overlaps the reflection band in the fourth region.

19. The elastic wave device of claim 12 further comprising a second elastic wave resonator electrically connected between the first elastic wave resonator and an unbalanced input terminal.

20. An elastic wave device comprising:
a piezoelectric substrate;
a high-frequency filter formed on the piezoelectric substrate having a high-frequency passband; and
a low-frequency filter formed on the piezoelectric substrate having a low-frequency passband lower than the high-frequency passband, the low-frequency filter including a first elastic wave resonator having a first plurality of interdigital transducers disposed between a first pair of reflectors, at least one reflector of the first pair of reflectors having a first region and a second region, the second region having a third region and a fourth region, the first region located nearer to the first plurality of interdigital transducers than the second region, the third region located nearer to the first plurality of interdigital transducers than the fourth region, a reflection band in the first region covering the low-frequency passband, a reflection band in the second region covering the high-frequency passband, and a center frequency of a reflection band in the fourth region being lower than a center frequency of a reflection band of the third region, the high-frequency filter including a second elastic wave resonator having a second plurality of interdigital transducers disposed between a second pair of reflectors, at least one reflector of the second pair of reflectors having a fifth region and a sixth region, the sixth region having a seventh region and an eighth region, the fifth region located nearer to the second plurality of interdigital transducers than the sixth region, the seventh region located nearer to the second plurality of interdigital transducers than the eighth region, a reflection band in the fifth region covering the high-frequency passband, a reflection band in the sixth region covering the low-frequency passband, and a center frequency of a reflection band in the eighth region being higher than a center frequency of a reflection band in the seventh region.

* * * * *